(12) United States Patent
Adachi et al.

(10) Patent No.: US 6,573,651 B2
(45) Date of Patent: Jun. 3, 2003

(54) HIGHLY EFFICIENT OLEDS USING DOPED AMBIPOLAR CONDUCTIVE MOLECULAR ORGANIC THIN FILMS

(75) Inventors: Chihaya Adachi, East Windsor, NJ (US); Marc A. Baldo, Princeton, NJ (US); Stephen R. Forrest, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 176 days.

(21) Appl. No.: 09/740,183

(22) Filed: Dec. 18, 2000

(65) Prior Publication Data

US 2002/0113545 A1 Aug. 22, 2002

(51) Int. Cl.[7] .................................. H01J 1/62
(52) U.S. Cl. .................. 313/504; 428/690; 257/40; 315/169.1
(58) Field of Search ................. 313/504, 506, 313/502, 503; 428/690, 691, 917; 257/40, 87, 89; 315/169.1, 169.3

(56) References Cited

U.S. PATENT DOCUMENTS

| | | | |
|---|---|---|---|
| 5,540,999 A | * 7/1996 | Yamamoto et al. | 313/503 |
| 5,703,436 A | 12/1997 | Forrest et al. | 313/506 |
| 5,707,745 A | 1/1998 | Forrest et al. | 428/432 |
| 5,709,959 A | * 1/1998 | Adachi et al. | 313/504 |
| 5,721,160 A | 2/1998 | Forrest et al. | 438/28 |
| 5,757,026 A | 5/1998 | Forrest et al. | 257/40 |
| 5,757,139 A | 5/1998 | Forrest et al. | 315/169.3 |
| 5,811,833 A | 9/1998 | Thompson | 257/40 |
| 5,834,893 A | 11/1998 | Bulovic et al. | 313/506 |
| 5,844,363 A | 12/1998 | Gu et al. | 313/560 |
| 5,861,219 A | 1/1999 | Thompson et al. | 428/690 |
| 5,874,803 A | 2/1999 | Garbuzov et al. | 313/506 |
| 5,917,280 A | 6/1999 | Burrows et al. | 313/506 |
| 5,922,396 A | 7/1999 | Thompson | 427/69 |
| 5,932,895 A | 8/1999 | Shen et al. | 257/89 |
| 5,953,587 A | 9/1999 | Forrest et al. | 438/99 |
| 5,981,306 A | 11/1999 | Burrows et al. | 438/22 |
| 5,986,268 A | 11/1999 | Forrest et al. | 250/372 |
| 5,986,401 A | 11/1999 | Thompson et al. | 313/504 |
| 5,998,803 A | 12/1999 | Forrest et al. | 257/40 |
| 6,005,252 A | 12/1999 | Forrest et al. | 250/458.1 |
| 6,013,538 A | 1/2000 | Burrows et al. | 438/22 |
| 6,013,982 A | 1/2000 | Thompson et al. | 313/506 |

OTHER PUBLICATIONS

Y. Kunugi, et al., "A Vapochromic LED", *J. Am. Chem. Soc.*, vol. 120, No. 3, pp. 589–590, 1998.

M. A. Baldo, et al., "Highly efficient phosphorescent emission from organic electroluminescent devices," Nature, Sep. 1998, vol. 395, pp. 151–154.

D.F. O'Brien, et al., "Improved energy transfer in electrophosphorescent devices", *Applied Physics Letters*, vol. 74, No. 3, pp. 442–444, (Jan. 18, 1999).

(List continued on next page.)

*Primary Examiner*—Haissa Philogene
*Assistant Examiner*—Tuyet T. Vo
(74) *Attorney, Agent, or Firm*—Kenyon & Kenyon

(57) ABSTRACT

The present invention is directed to simplified OLED structures comprising an anode layer, a hole injecting layer (HIL) in direct contact with the anode layer, an emissive organic electron transporting layer (ETL) in direct contact with the hole injecting layer, and a cathode layer in direct contact with the emissive organic electron transporting layer. The hole injecting material used in the hole injecting layer is characterized, in particular, as being an organic material having an ionization potential that is not more than about 0.7 eV greater than the ionization potential of the material used for the anode layer. The emissive organic electron transporting layer comprises an organic electron transporting material and an organic hole-trapping emissive material, for example, an organic phosphorescent material that produces emission from a triplet excited state of an organic molecule.

19 Claims, 6 Drawing Sheets

OTHER PUBLICATIONS

M.A. Baldo, et al., "Very high efficiency green organic light–emitting devices based on electrophosphorescence", *Applied Physics Letters*, vol. 75, No. 1, pp. 4–6, (1999).

T. Tsutsui et al., "High Quantum Efficiency in Organic Light–Emitting Devices with Iridium–Complex as a Triplet Emissive Center", *Japanese J. Appl. Phys.*, Part 2, vol. 38, pp. L1502–L1504 (Dec. 15, 1999).

C. Adachi et al., "High–efficiency organic electrophosphorescent devices with tris(2–phenylpyridine) iridium doped into electron–transporting materials", *Appl. Phys. Lett.*, vol. 77, No. 6, pp. 904–906 (Aug. 7, 2000).

M. J. Yang et al., "Use of Poly(9–vinylcarbazole) as Host Material for Iridium Complexes in High–Efficiency Organic Light–Emitting Devices", *Japanese J. Appl. Phys.*, Part 2, vol. 39, pp. L828–L829 (2000).

C. L. Lee et al., "Polymer phosphorescent light–emitting devices doped with tris(2–phenylpyridine) iridium as a triplet emitter", *Appl. Phys. Lett.*, vol. 77, No. 15, pp. 2280–2282 (Oct. 9, 2000).

Shirota et al., "Multilayered organic electroluminescent device using a novel starburst molecule, 4,4', 4"–tris(3–methylphenylphenylamino)triphenylamine, as a hole transport material", *Appl. Phys. Lett.*, vol. 65, No. 7, pp. 807–809 (Aug. 15, 1994).

Baldo et al., "Excitonic singlet–triplet ratio in a s semiconducting organic thin film", *Physical Review B*, pp. 422–428 (Nov. 15, 1999).

Kwong et al., "Efficient, Saturated Red Organic Ligh Emitting Devices Based on Phosphorescent Platinum (II) Porphyrins", *Chemistry of Materials*, vol. 11, No. 12, pp. 3709–3713 (Dec. 1999).

Djurovich et al., "Ir(III) Cyclometalated Complexes as Efficient Phosphorescent Emitters in Polymer Blend and Organic LEDs", *Polymer Preprints*, vol. 41, No. 1, pp. 770–771 (Mar. 2000).

C. Adachi et al., "Electroluminescence mechanisms in organic light emitting devices empolying a europium chelate doped in a wide energy gap bipolar conducting host", *J. Appl. Phys.*, vol. 87, No. 11, pp. 8049–8055 (Jun. 1, 2000).

M.A. Baldo et al., "Transient analysis of organic electrophosphorescence", *Phys. Rev. B*, vol. 62, No. 16, pp. 10967–10977 Oct. 15, 2000).

Co–pending U.S. Patent Application Serial No. 08/964,863, filed Nov. 5, 1997, entitled "A Highly Transparent Organic Light Emitting Device Employing a Non–metallic Cathode".

* cited by examiner

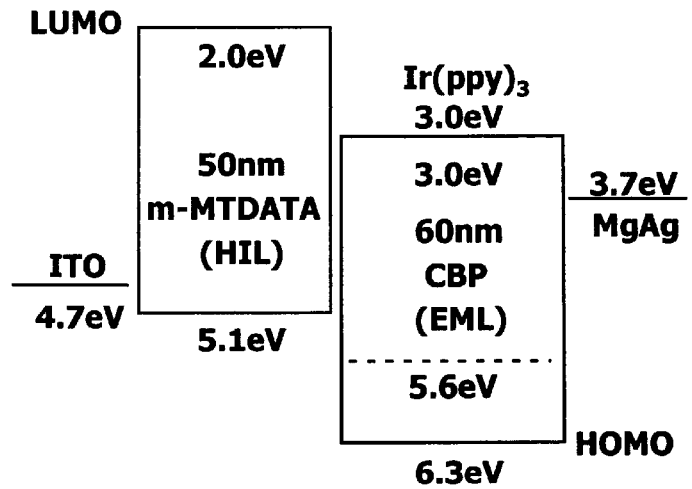
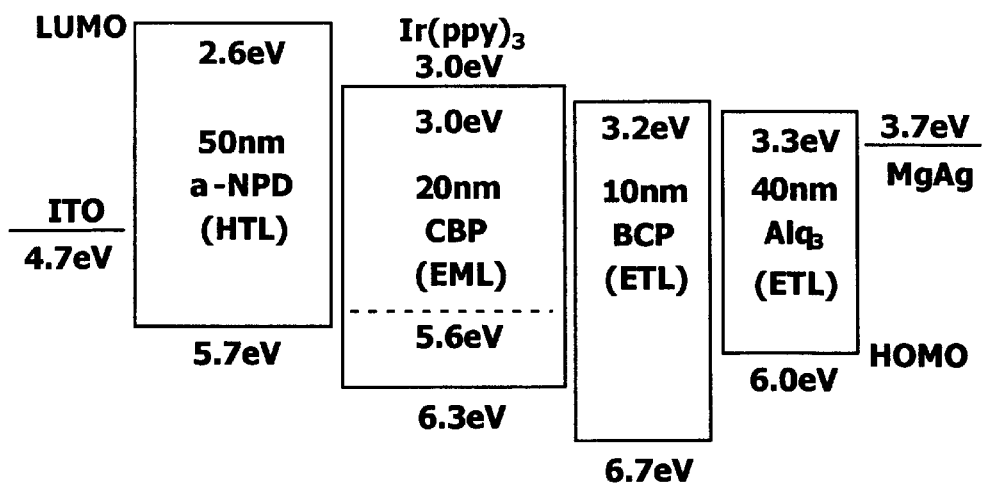
Figure 1: C. Adachi, et al.

HIGHLY EFFICIENT OLEDS USING DOPED AMBIPOLAR CONDUCTIVE MOLECULAR ORGANIC THIN FILMS

FIELD OF THE INVENTION

The present invention relates to highly efficient organic light emitting devices (OLEDs) utilizing doped ambipolar conductive molecular organic thin films.

BACKGROUND OF THE INVENTION

Organic light emitting devices (OLEDs), which make use of thin film materials that emit light when excited by electric current, are expected to become an increasingly popular form of flat panel display technology. This is because OLEDs have a wide variety of potential applications, including cell phones, personal digital assistants (PDAs), computer displays, informational displays in vehicles, television monitors, as well as light sources for general illumination. Due to their bright colors, wide viewing angle, compatibility with full motion video, broad temperature ranges, thin and conformable form factor, low power requirements and the potential for low cost manufacturing processes, OLEDs are seen as a future replacement technology for cathode ray tubes (CRTs) and liquid crystal displays (LCDs), which currently dominate the growing $40 billion annual electronic display market. Due to their high luminous efficiencies, electrophosphorescent OLEDs are seen as having the potential to replace incandescent, and perhaps even fluorescent, lamps for certain types of applications.

Light emission from OLEDs is typically via fluorescence or phosphorescence. As used herein, the term "phosphorescence" refers to emission from a triplet excited state of an organic molecule and the term "fluorescence" refers to emission from a singlet excited state of an organic molecule.

Successful utilization of phosphorescence holds enormous promise for organic electroluminescent devices. For example, an advantage of phosphorescence is that all excitons (formed by the recombination of holes and electrons in an EL), which are formed either as a singlet or triplet excited state, may participate in luminescence. This is because the lowest singlet excited state of an organic molecule is typically at a slightly higher energy than the lowest triplet excited state. This means that, for typical phosphorescent organometallic compounds, the lowest singlet excited state may rapidly decay to the lowest triplet excited state from which the phosphorescence is produced. In contrast, only a small percentage (about 25%) of excitons in fluorescent devices are capable of producing the fluorescent luminescence that is obtained from a singlet excited state. The remaining excitons in a fluorescent device, which are produced in the lowest triplet excited state of an organic molecule, are typically not capable of being converted into the energetically unfavorable higher singlet excited states from which the fluorescence is produced. This energy, thus, becomes lost to radiationless decay processes that heat-up the device.

As a consequence, since the discovery that phosphorescent materials can be used as the emissive material in highly efficient OLEDs, there is now much interest in finding still more efficient electrophosphorescent materials and OLED structures containing such materials.

High efficiency organic light emitting devices (OLEDs) using the phosphorescent dopant, fac tris(2-phenylpyridine) iridium ($Ir(ppy)_3$), have been demonstrated using several different conducting host materials. M. A. Baldo et al., Nature, vol. 395, 151 (1998); D. F. O'Brien et al., Appl. Phys. Lett., vol. 74, 442 (1999); M. A. Baldo et al., Appl. Phys. Lett., vol. 75, 4 (1999); T. Tsutsui et al., Japanese. J. Appl. Phys., Part 2, vol. 38, L1502 (1999); C. Adachi et al., Appl. Phys. Lett., vol. 77, 904 (2000); M. J. Yang et al., Japanese J. Appl. Phys., Part 2, vol. 39, L828 (2000); and C. L. Lee et al., Appl. Phys. Lett., vol. 77, 2280 (2000). Since the triplet level of the metal-ligand charge transfer state of the green-emitting $Ir(ppy)_3$ is between 2.5 eV and 3.0 eV, deep blue fluorophores with a peak wavelength at about 400 nm, such as 4,4'-N,N'-dicarbazole-biphenyl (CBP), are likely candidates as triplet energy transfer and exciton confining media. Using 6% to 10%-$Ir(ppy)_3$ in CBP leads to efficient $Ir(ppy)_3$ phosphorescence. In addition to the energetic resonance between the dopant and the host, the control of charge carrier injection and transport in the host layers is believed to be necessary for achieving efficient formation of radiative excitons. High electrophosphorescence efficiency has been achieved using $Ir(ppy)_3$ doped into CBP along with a 2,9-dimethyl-4,7-diphenyl-phenanthroline (BCP) electron transport and exciton blocking layer. M. A. Baldo et al., Appl. Phys. Lett., vol. 75, 4 (1999). In that device, the doped CBP layer was found to readily transport holes.

The compound 4,4',4"-tris(3-methylphenylphenylamino) triphenylamine ("m-MTDATA") was disclosed for use as a hole injecting material in electroluminescent OLEDs in which fluorescence was obtained from an electron transporting layer comprised of tris(8-hydroxyquinoline)aluminum ("$Alq_3$"). Shirota et al., Appl. Phys. Lett., vol. 65, No. 7, 807 (1994).

Typically electrophosphorescent OLEDs are comprised of several layers so as to achieve the desired combination of OLED performance characteristics. It would be desirable if the desired combination of OLED performance characteristics, especially including high external quantum efficiency, could be achieved used simplified OLED structures that make use of a smaller number of layers.

SUMMARY OF THE INVENTION

The present invention is directed to simplified OLED structures comprising an anode layer, a hole injecting layer (HIL) in direct contact with the anode layer, an emissive electron transporting layer (ETL) in direct contact with the hole injecting layer, and a cathode layer in direct contact with the emissive electron transporting layer. The hole injecting material used in the hole injecting layer is characterized, in particular, as being an organic material having an ionization potential (IP) that is not more than about 0.7 eV greater than the ionization potential of the material used for the anode layer. The emissive organic electron transporting layer comprises an organic electron transporting material and an organic hole-trapping emissive material, for example, a hole-trapping phosphorescent material.

BRIEF DESCRIPTION OF THE FIGURES

For the purpose of illustrating the invention, representative embodiments are shown in the accompanying figures, it being understood that the invention is not intended to be limited to the precise arrangements and instrumentalities shown.

FIG. 1 shows the energy level diagrams for a representative embodiment of the invention (Device I), as compared with a prior art OLED structure (Device II).

DETAILED DESCRIPTION OF THE PREFERRED EMBODIMENTS

Figure 2:
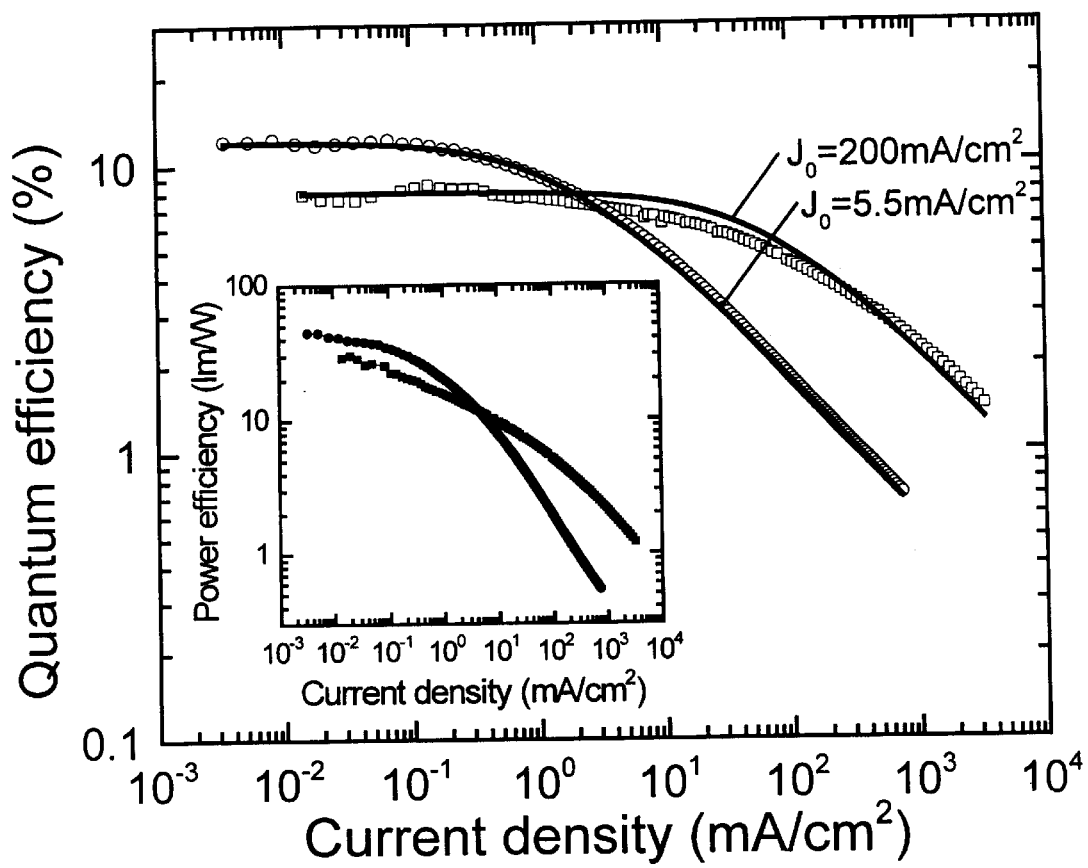
FIG. 2 shows the external quantum efficiency and power efficiency as a function of the current density for Device I (circles) as compared with Device II (squares).

The present invention will now be described in detail for specific preferred embodiments of the invention. These embodiments are intended only as illustrative examples and the invention is not to be limited thereto.

The simplified OLED structures of the present invention are illustrated and described herein for OLED structures in which the organic hole trapping emissive material is a phosphorescent emissive material, for which the emission is produced from a triplet excited state of an organic molecule. Thus, while the representative embodiments of the present invention are illustrated and described herein as using a phosphorescent organic material as the emissive material in the emissive organic electron transporting layer, the full scope of the present invention also includes use of a fluorescent material as the emissive material in the emissive electron transporting layer. More specifically, the full scope of the present invention includes OLEDs containing a hole-trapping fluorescent material wherein each of the materials in the OLED may have the combination of properties as described herein.

The representative simplified OLED structures of the present invention are illustrated for an electrophosphorescent OLED having the structure ITO/m-MTDATA/CBP:Ir(ppy)$_3$/Mg:Ag. As would be understood by one skilled in the art, such a structure corresponds to an OLED structure having an indium tin oxide (ITO) anode layer, an m-MTDATA (4,4',4"-tris(3-methylphenylphenylamino) triphenylamine) hole injecting layer in direct contact with the ITO layer, an Ir(ppy)$_3$-doped CBP layer in direct contact with the m-MTDATA hole injecting layer, and a magnesium-silver cathode layer in direct contact with the Ir(ppy)$_3$-doped CBP layer. Structures having an Ir(ppy)$_3$-doped concentration of about 7% in the host CBP layer are disclosed herein to have a peak external quantum ($\eta_{ext}$) and power efficiency ($\eta_p$) of 12.0±0.6% and 45±2 lm/W, respectively. This corresponds to an internal quantum efficiency of about 60%. These efficiencies are believed to be the highest efficiencies yet disclosed for an Ir(ppy)$_3$-doped electrophosphorescent OLED.

It is believed that the unexpectedly high efficiency of the simplified OLED structures of the present invention may be attributed to the unique combination of properties as exemplified by the representative materials of the present invention, that is, the simplified ITO/m-MTDATA/CBP:Ir(ppy)$_3$/Mg:Ag system. The simplified OLED structures of the present invention are represented, in particular, by structures in which the emissive, phosphorescent-doped, electron transporting layer is in direct contact with a low work function cathode material.

While the present invention is not limited by any theory about how the invention works, it is believed that the high OLED quantum efficiency is achieved, at least in part, because the representative materials permit direct hole trapping by the phosphorescent dopant material, with subsequent hole/electron recombination taking place directly on the phosphorescent material, which then emits phosphorescent radiation. In particular, it is believed that efficient hole trapping by the emissive phosphorescent dopant material makes it unnecessary to have an exciton and/or hole blocking layer between the emissive layer and the cathode layer. Such exciton and/or hole blocking layers have typically been used to reduce the hole/electron recombination losses at the cathode interface. For example, it is known that the efficiency of an OLED may be improved, in some cases, by including a hole blocking layer between the emissive electron transporting layer and the cathode so as to reduce or prevent losses in efficiency that are caused by hole quenching at the cathode. The present invention, thus, permits fabrication and manufacture of highly efficient electrophosphorescent OLEDs using a reduced number of organic layers.

The present invention has the further advantage of permitting use of a single layer, which is a hole injecting organic layer, between the anode layer and the emissive electron transport layer. The hole injecting materials of the present invention may be characterized as materials that planarize or wet the anode surface so as to provide efficient hole injection from the anode into the hole injecting material. The hole injecting materials of the present invention are further characterized as having HOMO (Highest Occupied Molecular Orbital) energy levels that favorably match up, as defined by their herein-described relative IP energies, with the adjacent anode layer on one side of the HIL layer and the phosphorescent-doped electron transporting layer on the opposite side of the HIL.

Preferred properties for the HIL material are such that holes can be efficiently injected from the anode into the HIL material. In particular, the HIL material preferably has an IP not more than about 0.7 eV greater that the IP of the anode material. More preferably, the HIL material has an IP not more than about 0.5 eV greater than the anode material. As shown in FIG. 1, the HIL material m-MTDATA is believed to have an IP (5.1 eV) that is about 0.4 eV greater than the IP of the ITO anode (4.7 eV).

The HIL materials are further distinguished from conventional hole transporting materials that are typically used in the hole transporting layer of an OLED in that such HIL materials have a hole mobility that is substantially less than the hole mobility of conventional hole transporting materials. For example, m-MTDATA has been identified as effective in promoting injection of holes from ITO into hole transporting layers (HTL) consisting of, for example 4,4'-bis[N-(naphthyl)-N-phenyl-amino]biphenyl ($\alpha$-NPD) or N,N'-bis(3-methylphenyl)-N,N'-diphenyl-[1,1'-biphenyl]4,4'-diamine (TPD), possibly due to reduction of the HTL HOMO level/ITO offset energy, or to wetting of the ITO surface. The HIL material m-MTDATA is believed to have a hole mobility of about $3\times10^{-5}$ cm$^2$ Vsec as compared with the conventional hole transporting materials such as $\alpha$-NPD or TPD, which have a hole mobility of about $5\times10^{-4}$ cm$^2$ Vsec and $9\times10^{-4}$ cm$^2$/Vsec, respectively. Thus, the m-MTDATA material has a hole mobility more than an order of magnitude less than the commonly used HTL materials $\alpha$-NPD and TPD.

While the improved efficiencies of the electrophosphorescent OLEDs of the present invention may result from a combination of properties, it is believed that the reduced hole mobility of the representative HIL material m-MTDATA may help to balance hole and electron injection. Thus, since the hole transporting materials that are typically used in an OLED tend to have substantially higher charge-carrying mobilities for holes than is typical for the electrons in the highest-mobility electron transporting materials, it is believed that the high OLED efficiencies disclosed herein show that it may not be necessary to use hole transporting materials having the highest possible hole mobilities. Thus, the present invention is further directed to HIL materials having a hole mobility not greater than about $1 \times 10^{-4}$ cm$^2$/Vsec.

The thickness of the HIL of the present invention needs to be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

The host electron transporting material in the ETL may be selected such that electrons can be efficiently injected from the cathode into the LUMO (Lowest Unoccupied Molecular Orbital) level of the electron transporting material. The LUMO level of an organic material may be generally characterized by the electron affinity of that material and the relative electron injection efficiently of a cathode may be generally characterized in terms of the work function of the cathode material. This means that the preferred properties of the host ETL material and the electron injecting material may be specified in terms of the electron affinity of the ETL material and the work function of the cathode material. In particular, so as to achieve high electron injection efficiency, the work function of the cathode material is preferably not greater than the electron affinity of the electron transporting material by more than about 0.75 eV, more preferably, by not more than about 0.5 eV. Most preferably, the electron affinity of the electron transporting material is greater than the work function of the cathode material. As shown in FIG. 1, for the representative embodiment of the present invention (Device I), in which a Mg:Ag cathode is used in direct contact with a CBP layer, the work function of the Mg:Ag cathode (about 3.7 eV) is about 0.7 eV. greater than the electron affinity of the electron transporting material (about 3.0 eV).

The host electron transporting material preferably has a LUMO level corresponding to an electron affinity that is greater than or equal to the electron affinity of the dopant phosphorescent material, such that electron transport in the electron transporting layer occurs predominantly by electron transport through the LUMO levels of the electron transporting host material. However, the electron affinity of the host electron transporting material is preferably not more than about 0.5 eV greater than the phosphorescent dopant, such that efficient electron injection can readily occur from the host to the dopant, thus resulting in efficient hole/electron recombination directly on the hole-trapping phosphorescent dopant. For the representative embodiments of the present invention in which CBP is used as the host electron transporting material and Ir(ppy)$_3$ is used as the phosphorescent dopant, the host electron transporting material has an electron affinity (about 3.0 eV) that is about equal to the electron affinity of the phosphorescent dopant (also about 3.0 eV).

A hole-trapping phosphorescent material may be characterized as a phosphorescent material having an IP that is approximately the same as or sufficiently less than the IP of the host material, such that holes can be effectively trapped by the phosphorescent dopant. So as to produce an effective enhancement of the hole/electron recombination efficiency, the phosphorescent dopant preferably has an IP that is at least about 0.5 eV less than the IP of the host material. For the representative embodiment of the present invention as shown in FIG. 1 (Device I), the electron transporting host material has an IP (6.3 eV) that is about 0.7 eV greater than the IP of the phosphorescent dopant (5.6 eV).

In addition, the phosphorescent dopant material may be characterized as preferably having an IP that is approximately equal, but not necessarily precisely equal, to the IP of the adjacent HIL material. Such a close match in energy levels allows effective hole transport from the HIL layer directly into the phosphor such that more efficient hole/electron recombination can occur directly on the emissive phosphorescent-molecule. For example, for the representative embodiment of the present invention, in which Ir(ppy)$_3$ is doped into CBP, the phosphorescent Ir(ppy)$_3$-dopant has an IP about 0.5 eV greater than the IP of the adjacent m-MTDATA material. In any case, the IP of the dopant is preferably not greater than the IP of the HIL material by more than about 0.7 eV.

The phosphorescent dopant material may be doped into the host electron transporting material at a concentration level so as to achieve the desired combination of OLED performance characteristics, for example, a high initial quantum efficiency, or perhaps alternatively, a high lifetime quantum efficiency. Typically, the phosphorescent dopant material concentration ranges from about 1 weight percent up to about 10 weight percent, and perhaps up to 20 weight percent or still higher in some cases. Phosphorescent emission from an excited triplet state of an organic molecule is produced when a voltage is applied across the phosphorescent-doped ETL of such an OLED.

The hole injecting materials, the electron transporting materials and the phosphorescent dopant materials may each be selected from a vast array of materials known in the art, provided that the relative energy levels of these materials, when used in combination, have relative values as described herein. Representative materials, for example, of the hole injecting materials, the electron transporting materials, and the phosphorescent materials include the types of materials such as disclosed in M. A. Baldo et al., Nature, vol. 395, 151 (1998); D. F. O'Brien et al., Appl. Phys. Lett., vol. 74, 442 (1999); M. A. Baldo et al., Appl. Phys. Lett., vol. 75, 4 (1999); T. Tsutsui et al., Japanese. J. Appl. Phys., Part 2, vol. 38, L1502 (1999); M. J. Yang et al., Japanese J. Appl. Phys., Part 2, vol. 39, L828 (2000); and C. L. Lee et al., Appl. Phys. Lett., vol. 77, 2280 (2000); Baldo et al., Physical Review B 422–428 (1999); Kwong et al., Chemistry of Materials, vol. 11, 3709–3713 (1999); Djurovich et al., Polymer Preprints, vol. 41, No. 1, 770 (2000). The ETL materials may include, in particular, an aryl-substituted oxadiazole, an aryl-substituted triazole, an aryl-substituted phenanthroline, a benzoxazoles or a benzthiazole compound, for example, 1,3-bis(N,N-t-butyl-phenyl)-1,3,4-oxadiazole ("OXD-7"); 3-phenyl-4-(1'-naphthyl)-5-phenyl-1,2,4-triazole ("TAZ"); 2,9-dimethyl- 4,7-diphenyl-phenanthroline ("BCP"); bis(2-(2-hydroxyphenyl)-benzoxazolate)zinc; or bis(2-(2-hydroxyphenyl)-benzthiazolate)zinc; such as disclosed in C. Adachi et al., Appl. Phys. Lett., vol. 77, 904 (2000).

Figure 6:
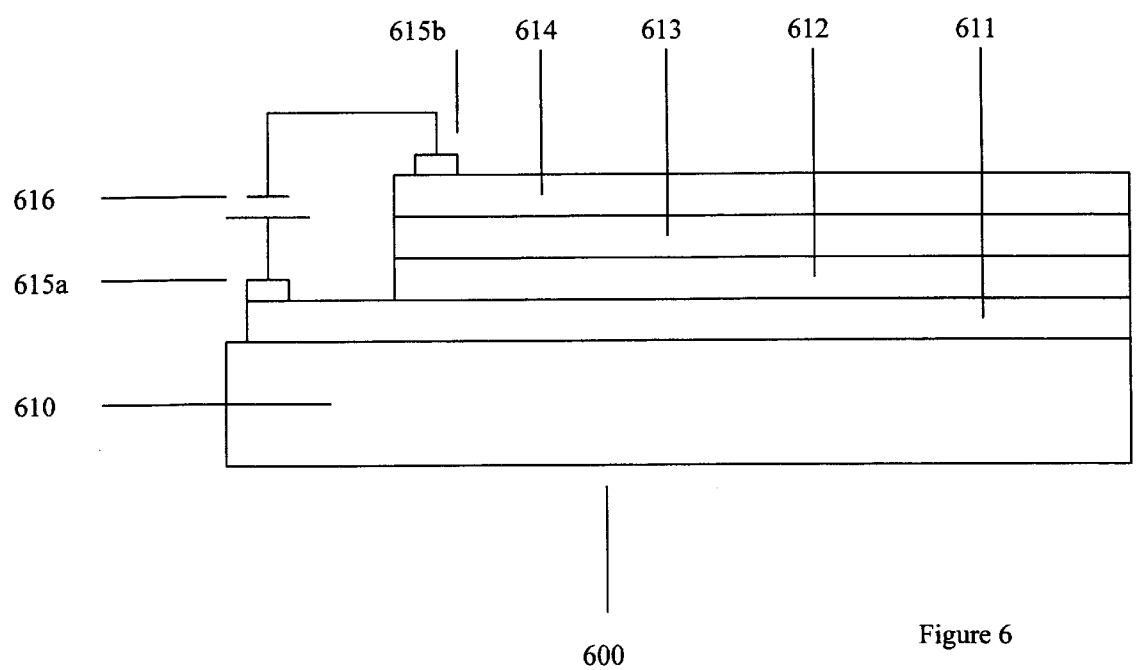
FIG. 6 shows a schematic representation of an OLED structure according to the present invention.

A representative embodiment of the OLED structure of the present invention is shown in FIG. 6. The device 600 includes a substrate 610, an anode layer 611, a hole injecting layer 612, an organic electron transporting layer 613 and a cathode 614. The organic electron transporting layer 613 also functions as the emission layer. Light emission from the emissive organic electron transporting layer 613 occurs when a voltage 616 is applied across the cathode 614 and the anode 611 at contacts 615b and 615a, respectively. The materials used in the device 600 include any suitable materials which fulfill the function(s) of the respective layer(s).

For example, the organic hole injecting material and the organic electron transporting material are selected, in particular, so as to balance hole and electron injection as well as hole and electron transport through the device.

The materials listed below are provided for illustrative purposes only. The device 600 is manufactured upon a substrate 610. The substrate 610 may be fabricated from a transparent or opaque material, such as glass, quartz, sapphire or plastic. The substrate 610 is, for example, rigid, flexible, conformable, and/or shaped to a desired configuration. For transparent OLEDs or top-emitting OLEDs, a transparent cathode such as disclosed in U.S. Pat. No. 5,703,436, or co-pending U.S. patent applications Ser. Nos. 08/964,863 and 09/054,707, may be used. A transparent cathode has light transmission characteristics such that the OLED has an optical transmission of at least about 50%. Preferably, the transparent cathode has optical transmission characteristics that permit the OLED to have an optical transmission of at least about 70%, more preferably, at least about 85%.

A top-emitting device is one for which light is produced only out of the top of the device and not through the substrate. The substrate and bottom electrode of such top-emitting devices may each be comprised of opaque and/or reflective materials, for example, with the electrode being a reflective thick metal layer. The substrate is typically referred to as being at the bottom of the device.

The deposition techniques for any of the above-listed layers and materials are well-known in the art. For example, a representative method of depositing the OLED layers is by thermal evaporation (or spin coating if a polymer LED is used); a representative method of depositing metal layers is by thermal or electron-beam evaporation; and a representative method of depositing indium tin oxide is by electron-beam evaporation or sputtering.

The present invention may be used to provide stable, efficient, high brightness, monochromatic, multicolor, or full-color, flat panel displays of any size. The images created on such displays could be text or illustrations in full-color, in any resolution depending on the size of the individual OLEDs. Display devices of the present invention are therefore appropriate for an extremely wide variety of applications including billboards and signs, computer monitors, and telecommunications devices such as telephones, televisions, large area wall screens, theater screens and stadium screens. The structures described herein are included, for example, in a plurality of pixels in a light emitting device or as part of a single-pixel, flat panel backlight device. Moreover, the structures described herein may be used as part of a laser device.

Because of the exceptionally high luminous efficiencies that are possible for phosphorescent-based OLEDs, as compared with OLEDs generally, and especially with respect to conventional inorganic LEDs, the phosphorescent-based OLEDs of the present invention may also be used as a light source for illumination applications. Such light sources could replace conventional incandescent or fluorescent lamps for certain types of illumination applications. Such phosphorescence-based OLEDs could be used, for example, in large backplane light sources that produce illumination of a desired color.

The devices disclosed in the following patents or co-pending patent applications, each of which is incorporated herein in its entirety, may benefit from incorporation of the organic light emitting devices disclosed herein. U.S. Pat. Nos. 5,703,436; 5,707,745; 5,721,160; 5,757,026; 5,757,139; 5,811,833; 5,834,893; 5,844,363; 5,861,219; 5,874,803; 5,917,280; 5,922,396; 5,932,895; 5,953,587; 5,981,306; 5,986,268; 5,986,401; 5,998,803; 6,005,252; 6,013,538; and 6,013,982; and co-pending U.S. patent application Ser. Nos. 08/779,141; 08/821,380; 08/977,205; 08/865,491; and 08/928,800. The materials, methods and apparatus disclosed in these patents and co-pending patent applications may also be used to prepare the OLEDs of the present invention.

This invention will now be described in detail with respect to showing how certain specific representative embodiments thereof can be made, the materials, apparatus and process steps being understood as examples that are intended to be illustrative only. In particular, the invention is not intended to be limited to the methods, materials, conditions, process parameters, apparatus and the like specifically recited herein.

EXAMPLES OF THE INVENTION

In a representative embodiment of the present invention, organic layers were deposited by high vacuum ($10^{-6}$ Torr) thermal evaporation onto a clean glass substrate precoated with indium tin oxide (ITO), which was used as the anode of the device and which had a sheet resistance of 20 $\Omega$/square. Prior to film deposition, the substrate was solvent degreased and cleaned in a UV-ozone chamber before it was loaded into the deposition system. Device I had a 50 nm thick layer of m-MTDATA deposited on the ITO. Then, a 60 nm thick ETL layer of Ir(ppy)$_3$ and CBP was co-deposited onto the m-MTDATA layer. Representative embodiments used a fixed 7% concentration of Ir(ppy)$_3$ since this resulted in the highest next A shadow mask with 1 mm diameter openings was used to define the cathodes of 100 nm thick 25:1 Mg:Ag with a 20 nm thick cap of Ag.

Comparative Example

Using substantially the same type of fabrication procedures, a conventional heterostructure device (Device II), consisting of ITO/$\alpha$-NPD (50 nm)/7%-Ir(ppy)$_3$:CBP (20 nm)/BCP (10 nm)/tris(8-hydroxyquinoline)aluminum (Alq$_3$) (40 nm)/Mg—Ag (100 nm)/Ag (20 nm), was fabricated for comparison.

Experimental Results

A variety of experiments were carried out to determine how the representative embodiment of the invention (Device I) differed from the comparative device (Device II).

To locate the exciton formation zone, a local doping technique was employed where a thin 7%-Ir(ppy)$_3$:CBP light emissive slab was grown into the CBP host layer at varying distances between the cathode and anode contacts. The energy level diagrams of Devices I and II are shown in FIG. 1. The positions of the Ir(ppy)$_3$ HOMO and LUMO levels relative to those of CBP were estimated using a combination of ultraviolet photoelectron and optical absorption spectroscopy.

FIG. 2 shows the dependencies of $\eta_{ext}$ and $\eta_p$ on current (J) for the devices studied. In Device I, a maximum $\eta_{ext}$=(12.0±0.6)% and $\eta_p$=(45±2) lm/W were obtained at low currents (J<0.1 mA/cm$^2$), which is significantly higher than $\eta_{ext}$=(8.0±0.6)% for Device II. Thus, the simplified device architecture exhibits efficient radiative decay of Ir(ppy)$_3$ triplet excitons that is believed to be due to balanced hole and electron injection into the Ir(ppy)$_3$:CBP light emitting layer.

The gradual roll-off in $\eta_{ext}$ with increasing current has previously been ascribed to triplet-triplet (T-T) annihilation, C. Adachi et al., J. Appl. Phys. vol. 87, 8049 (2000); and M. A. Baldo et al., Phys. Rev. B, vol. 62, 10967 (2000), in which case:

$$\eta_{ext} = \frac{\eta_0 J_0}{4J}\left(\sqrt{1+8\frac{J}{J_0}} - 1\right) \text{ where,} \quad (1)$$

$$J_0 = \frac{4qd}{\kappa_{TT}\tau^2}. \quad (2)$$

Here, q is the electron charge, d is the thickness of the exciton formation zone, τ is the phosphorescent lifetime, and $\tau_{TT}$ is the T-T annihilation quenching parameter. Now, $\eta_{ext}=\eta_0$ at J=0, and when J=J$_0$, then $$\eta_{ext} = \frac{1}{2}\eta_0.$$

From FIG. 2 (solid lines), a best fit of the model to the data for devices I and II gives $J_{0(I)}$=5.5 mA/cm$^2$ and $J_{0(II)}$=200 mA/cm$^2$, respectively. The ratio of $$\frac{J_{0(II)}}{J_{0(I)}} \cong 36$$

implies that the width of the exciton formation zone (d) in Device I is significantly narrower than that of Device II (thus leading to a high local concentration of triplets and hence increased T-T annihilation) assuming that $\tau_{TT}$ is a material property independent of excitation density and device structure.

Figure 3:
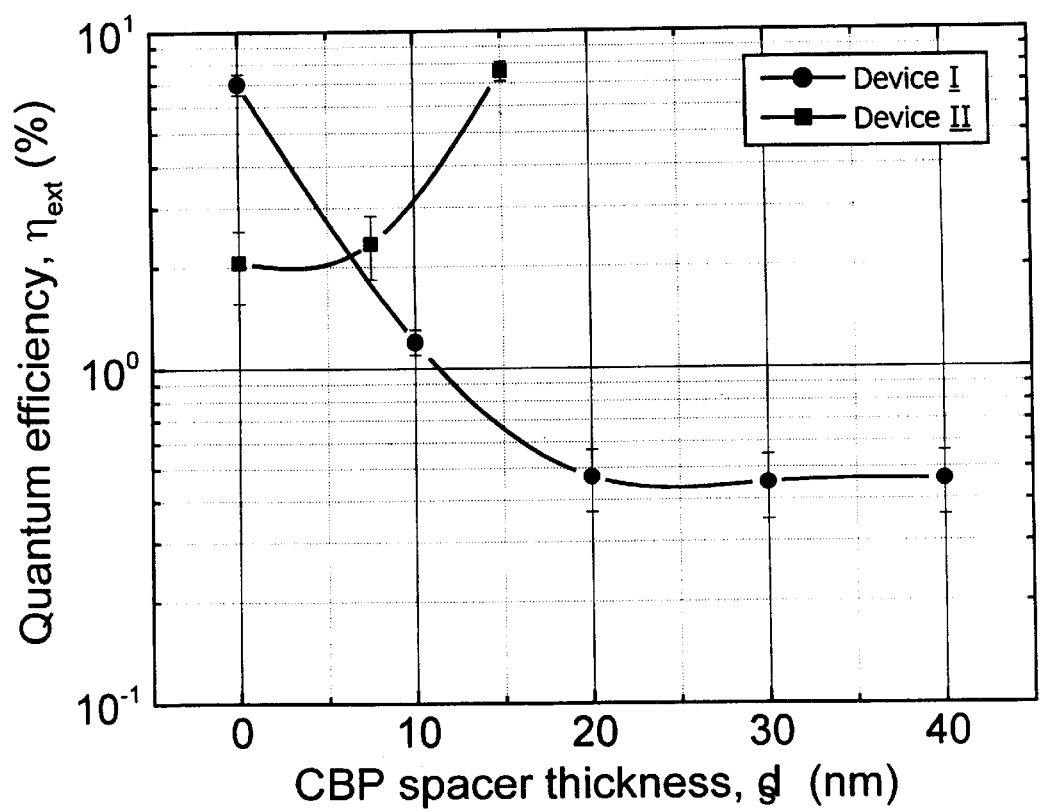
FIG. 3 shows the external quantum efficiency as a function of CBP spacer thickness for Device I as compared with Device II.
Figure 4:
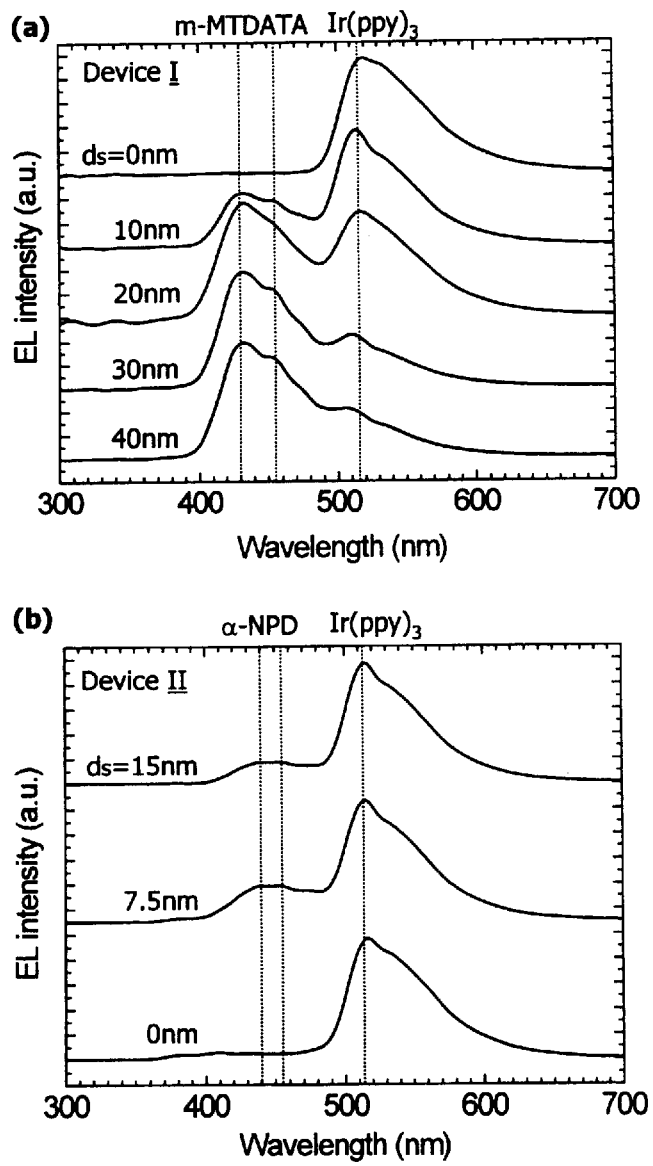
FIG. 4 shows the EL intensity as a function of wavelength for Device I as compared with Device II.
Figure 5:
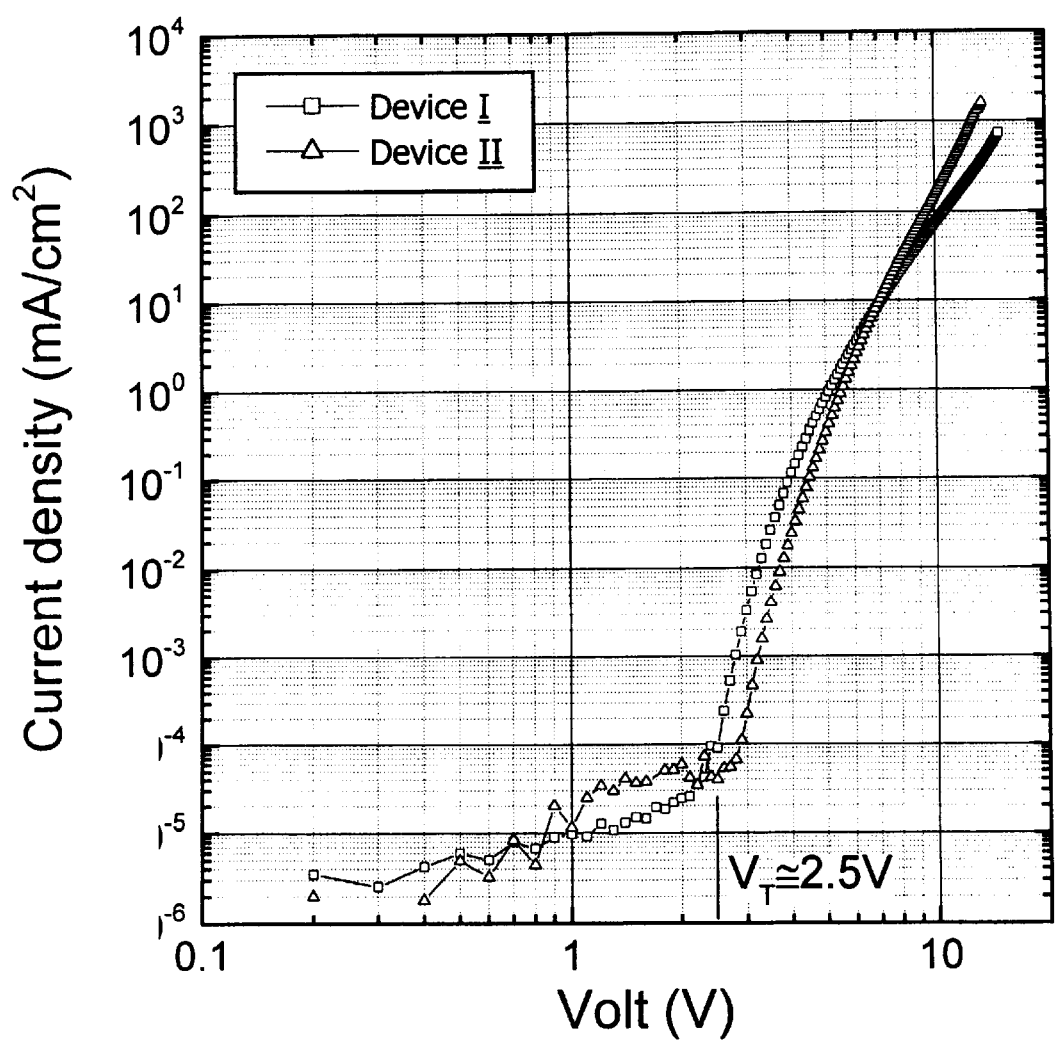
FIG. 5 shows the current density as a function of voltage for Device I as compared with Device II.

To understand the origin of the high $\eta_{ext}$ in Device I, the location of the exciton formation zone was determined by employing a 5 nm thick 7%-Ir(ppy)$_3$:CBP slab located at various positions within the CBP transport layer. The doped layer was systematically moved from the m-MTDATA/Ir(Ppy)$_3$:CBP (Device I) or α-NPD/Ir(Ppy)$_3$:CBP (Device II) interface to the cathode side. FIGS. 3 and 4 show the variations of $\eta_{ext}$ and the electroluminescence spectra as functions of the distance (d$_s$) of the doped layer from these interfaces.

For Device I (filled circles in FIG. 3), $\eta_{ext}$=(7.0±0.5)% is obtained with d$_s$=0 nm, decreasing rapidly with increasing d$_s$. Although only Ir(ppy)$_3$ triplet emission ($\lambda_{max}$~515 nm) was observed for d$_s$=0 nm (FIG. 4(a)), the contribution from Ir(ppy)$_3$ gradually decreases, accompanied by an increase of blue emission (with peaks at $\lambda_{max}$=430 nm and $\lambda_s$=455 nm) with increasing d$_s$. The blue emission is due to m-MTDATA fluorescence.

These observations are believed to lead to two conclusions. The Ir(ppy)$_3$:CBP layer predominantly (although not exclusively) transports electrons since carrier recombination and exciton formation occur within 10 nm of the m-MTDATA/Ir(ppy)$_3$:CBP interface. This is consistent with the observation that the Ir(ppy)$_3$ LUMO energy is approximately equal to that of CBP (3.0 eV) (FIG. 1). Furthermore, Ir(Ppy)$_3$ excitons are believed to be formed through direct hole injection from m-MTDATA into the Ir(Ppy)$_3$ HOMO levels. This is apparent since the exciton formation zone moves with d$_s$. When the Ir(ppy)$_3$:CBP doped slab is positioned away from the m-MTDATA/CBP interface (d$_s$=10 nm to 40 nm), the spectra are composed of both m-MTDATA and Ir(Ppy)$_3$ emission. Therefore, holes partly accumulate in the m-MTDATA layer in close proximity to the m-MTDATA/CBP interface, and recombine with electrons injected from CBP into m-MTDATA, leading to m-MTDATA exciton formation along with Ir(ppy)$_3$ exciton formation in the Ir(ppy)$_3$-doped CBP slab. Hole accumulation at the m-MTDATA/CBP interface results from the large energy barrier (1.2 eV) between the HOMO levels of m-MTDATA and CBP. At d$_s$=0 nm, on the other hand, since no m-MTDATA emission is observed, most holes are directly injected from the m-MTDATA HOMO (5.1 eV) into the Ir(Ppy)$_3$ HOMO (5.6 eV) levels, which recombine with electrons transported by CBP, leading to direct Ir(ppy)$_3$ exciton formation.

The m-MTDATA/CBP interface also appears to play an important role in Ir(ppy)$_3$ triplet exciton confinement. The phosphorescence onset wavelengths of CBP and m-MTDATA are at 475 nm and 490 nm, respectively, which are comparable with the Ir py)$_3$ phosphorescent emission peak. Here, the relaxed Ir(ppy)$_3$ triplet state is at a slightly lower energy compared with the unrelaxed triplet states of CBP and m-MTDATA, leading to efficient triplet exciton confinement and radiative decay at the interface. For example, when α-NPD and TPD are employed as HTLs, $\eta_{ext}$ is found to be less than 6% with an appreciable contribution to the luminescence due to HTL emission. Since the α-NPD LUMO (2.6 eV) is lower than that of m-MTDATA, electron injection from Ir(Ppy)$_3$:CBP into the HTL occurs, leading to a reduction in $\eta_{ext}$.

While the doped CBP layer primarily transports electrons, the existence of Ir(ppy)$_3$ luminescence even for d>0 nm suggests that a neat CBP layer also serves a hole transporting medium.

For Device II, a maximum $\eta_{ext}$=(8.0±0.5)% was observed when a 5 nm-thick Ir(ppy)$_3$:CBP doped layer was placed close to the BCP layer (filled squares in FIG. 3), suggesting that, in this case, Ir(ppy)$_3$:CBP preferentially transports holes, and exciton formation mainly occurs near the Ir(ppy)$_3$:CBP/BCP interface. At both d$_s$=7.5 nm and 15 nm, the electroluminescence spectra are comprised of two components, Ir(ppy)$_3$ emission at $\lambda_{max}$=515 nm and α-NPD emission at $\lambda_{max}$=440 nm and 455 nm (FIG. 4(b)). The presence of α-NPD emission again suggests hole accumulation at the α-NPD/CBP interface when a neat CBP layer exists between these layers, leading to carrier recombination partly within the HTL.

In the J-V characteristics of conventional α-NPD/Alq$_3$-heterostructure OLEDs, there are typically two distinct regions of operation above and below the turn-on voltage V$_T$. Above V$_T$, the current approximately follows a power law dependence given by J=αV$^{(m+1)}$, where α is a constant and m is typically between 7 and 9. However, such devices typically exhibit an abrupt current increase immediately above V$_T$ (≈2.5V). The local doping experiment described herein clearly demonstrated that the Ir(ppy)$_3$:CBP layer efficiently transports electrons in Device I, leading to exciton formation near the m-MTDATA/Ir(ppy)$_3$:CBP interface. Furthermore, the T-T annihilation analysis reveals that the width of the exciton formation zone in Device I is narrower than that of Device II by a factor of 1/36. Therefore, the exciton formation zone is very close to the m-MTDATA/Ir (ppy)$_3$:CBP interface, which has a width <0.3 nm. This leads to a high electric field at the interface due to charge accumulation. The high field, in turn, is believed to promote efficient hole injection and carrier recombination at the interface. Hence, the J-V characteristics are controlled by the interfacial properties, where charge accumulation results in the abrupt increase in current above V$_T$=2.5V. Further, Device I has a slightly lower V$_T$ than does Device II due to the reduced voltage drops across the simplified structure. As in the case of single layer polymer devices, the onset of light emission is found to occur at approximately $V_T$ which corresponds to the minimum potential required to form an exciton on an Ir(ppy)$_3$ molecule.

These experimental results demonstrate that an Ir(ppy)$_3$:CBP layer has ambipolar carrier transport characteristics dependant on the type of structure in which it is present. In Device I, electrons are injected from a Mg—Ag cathode into CBP, and they subsequently traverse the layer where they recombine with holes directly injected from m-MTDATA into Ir(ppy)$_3$ HOMO levels. In the conventional heterostructure Device II, the carrier recombination zone is located near the cathode, suggesting that the Ir(ppy)$_3$:CBP layer also transports holes. Hence, depending on the combination of the carrier injection layers adjacent to the emitting layer, Ir(Ppy)$_3$:CBP can transport either holes or electrons. Using this ambipolar conduction property, an efficient and simple electrophosphorescent OLED is demonstrated.

Those with skill in the art may recognize various modifications to the embodiments of the invention described and illustrated herein. Such modifications are intended to be covered by the spirit and scope of the appended claims.

What is claimed is:

1. An organic light emitting device, comprising:
    an anode layer comprising an anode material having a characteristic ionization potential;
    an organic hole injecting layer comprising an organic hole injecting material having a characteristic ionization potential, the organic hole injecting layer being in direct contact with the anode layer, wherein the ionization potential of the organic hole injecting material is not more than 0.7 eV greater than the ionization potential of the anode material;
    an organic electron transporting layer comprising an organic electron transporting material and an organic hole-trapping emissive material, the organic electron transporting layer being in direct contact with the organic hole injecting layer; and
    a cathode layer in direct contact with the organic electron transporting layer.

2. The organic light emitting device of claim 1, wherein the ionization potential of the organic hole injecting material is not more than about 0.5 eV greater than the ionization potential of the anode material.

3. The organic light emitting device of claim 1, wherein the organic hole-trapping emissive material is a phosphorescent material.

4. The organic light emitting device of claim 3, wherein the phosphorescent material has a characteristic ionization potential and the organic electron transporting material has a characteristic ionization potential and the characteristic ionization potential of the phosphorescent material is at least about 0.5 eV less than the characteristic ionization potential of the organic electron transporting material.

5. The organic light emitting device of claim 3, wherein the characteristic ionization potential of the phosphorescent material is at least about 0.7 eV less than the characteristic ionization potential of the organic electron transporting material.

6. The organic light emitting device of claim 3, wherein the characteristic electron affinity of the organic electron transporting material is not more than about 0.5 eV greater than the characteristic electron affinity of the phosphorescent material.

7. The organic light emitting device of claim 3, wherein the anode comprises ITO.

8. The organic light emitting device of claim 3, wherein the organic hole injecting material comprises 4,4',4"-tris(3-methylphenylphenylamino)triphenylamine.

9. The organic light emitting device of claim 3, wherein the electron transporting material comprises 4,4'-N,N'-dicarbazole-biphenyl.

10. The organic light emitting device of claim 3, wherein the phosphorescent material comprises fac tris(2-phenylpyridine)iridium.

11. The organic light emitting device of claim 3, wherein the cathode layer comprises magnesium and silver.

12. The organic light emitting device of claim 3, wherein the phosphorescent material has a characteristic electron affinity and the organic electron transporting material has a characteristic electron affinity and the characteristic electron affinity of the organic electron transporting material is equal to or greater than the characteristic electron affinity of the phosphorescent material.

13. The organic light emitting device of claim 12, wherein the cathode layer comprises a cathode material having a characteristic work function and the characteristic work function of the cathode material is not more than about 0.75 eV greater than the characteristic electron affinity of the organic electron transporting material.

14. The organic light emitting device of claim 12, wherein the characteristic work function of the cathode material is not more than about 0.5 eV greater than the characteristic electron affinity of the organic electron transporting material.

15. The organic light emitting device of claim 3, wherein the phosphorescent material has a characteristic ionization potential and the characteristic ionization potential of the phosphorescent material is approximately equal to or greater than the characteristic ionization potential of the organic hole injecting material.

16. The organic light emitting device of claim 15, wherein the characteristic ionization potential of the phosphorescent material is not more than 0.7 eV greater than the characteristic ionization potential of the organic hole injecting material.

17. The organic light emitting device of claim 16, wherein the characteristic ionization potential of the phosphorescent material is not more than 0.5 eV greater than the characteristic ionization potential of the organic hole injecting material.

18. An organic light emitting device, comprising:
    an ITO anode layer;
    a hole injecting layer comprising 4,4',4"-tris(3-methylphenylphenylamino)triphenylamine, the hole injecting layer being in direct contact with the ITO anode layer;
    an emissive layer comprising 4,4'-N,N'-dicarbazole-biphenyl doped with fac tris(2-phenylpyridine)iridium, the emissive layer being in direct contact with the hole injecting layer; and
    a cathode layer comprising magnesium and silver, the cathode layer being in direct contact with the emissive layer.

19. The organic light emitting device of claim 18, wherein fac tris(2-phenylpyridine)iridium comprises 7 weight percent of the emissive layer.

* * * * *